US009230812B2

(12) United States Patent
Chen et al.

(10) Patent No.: US 9,230,812 B2
(45) Date of Patent: Jan. 5, 2016

(54) METHOD FOR FORMING SEMICONDUCTOR STRUCTURE HAVING OPENING

(71) Applicant: UNITED MICROELECTRONICS CORP., Hsin-Chu (TW)

(72) Inventors: Chieh-Te Chen, Kaohsiung (TW); Yu-Tsung Lai, Tainan (TW); Hsuan-Hsu Chen, Tainan (TW); Feng-Yi Chang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 111 days.

(21) Appl. No.: 13/899,577

(22) Filed: May 22, 2013

(65) Prior Publication Data

US 2014/0349236 A1 Nov. 27, 2014

(51) Int. Cl.
H01L 21/311 (2006.01)
H01L 21/28 (2006.01)
H01L 21/768 (2006.01)
H01L 21/033 (2006.01)

(52) U.S. Cl.
CPC ............ *H01L 21/28* (2013.01); *H01L 21/0332* (2013.01); *H01L 21/31144* (2013.01); *H01L 21/76816* (2013.01)

(58) Field of Classification Search
USPC ................................................ 430/316, 317
See application file for complete search history.

(56) References Cited

U.S. PATENT DOCUMENTS

| 5,245,470 | A | 9/1993 | Keum |
| 5,446,669 | A | 8/1995 | Yamashita |
| 5,602,644 | A | 2/1997 | Ota |
| 5,689,339 | A | 11/1997 | Ota |
| 5,716,763 | A | 2/1998 | Benoit |
| 5,807,439 | A | 9/1998 | Akatsu |
| 6,033,811 | A | 3/2000 | Lee |
| 6,275,744 | B1 | 8/2001 | Yoshida |
| 6,286,524 | B1 | 9/2001 | Okuchi |
| 6,395,438 | B1 | 5/2002 | Bruce |
| 6,470,489 | B1 | 10/2002 | Chang |
| 6,509,971 | B2 | 1/2003 | Inoue |
| 6,566,021 | B2 | 5/2003 | Wang |
| 6,684,382 | B2 | 1/2004 | Liu |
| 6,724,463 | B2 | 4/2004 | Taniguchi |
| 6,753,115 | B2 | 6/2004 | Zhang |
| 6,763,514 | B2 | 7/2004 | Zhang |
| 6,781,670 | B2 | 8/2004 | Krautschik |
| 6,787,463 | B2 | 9/2004 | Mardian |
| 6,788,477 | B2 | 9/2004 | Lin |
| 6,795,169 | B2 | 9/2004 | Tanaka |
| 6,815,664 | B2 | 11/2004 | Wang |
| 6,852,453 | B2 | 2/2005 | Wu |
| 6,855,607 | B2 | 2/2005 | Achuthan |
| 6,867,844 | B2 | 3/2005 | Vogel |
| 6,891,596 | B2 | 5/2005 | Rostalski |
| 6,961,920 | B2 | 11/2005 | Zach |
| 6,979,822 | B1 | 12/2005 | Stewart |
| 7,005,235 | B2 | 2/2006 | Lin |
| 7,013,446 | B2 | 3/2006 | Ohba |
| 7,090,963 | B2 | 8/2006 | Medeiros |
| 7,112,495 | B2 | 9/2006 | Ko |
| 7,150,945 | B2 | 12/2006 | Mackey |
| 7,247,887 | B2 | 7/2007 | King |
| 7,250,658 | B2 | 7/2007 | Doris |
| 7,386,829 | B2 | 6/2008 | Lee |
| 7,521,324 | B2 | 4/2009 | Ohmi |
| 7,531,437 | B2 | 5/2009 | Brask |
| 7,592,270 | B2 | 9/2009 | Teo |
| 7,624,369 | B2 | 11/2009 | Graur |
| 2005/0048223 | A1 | 3/2005 | Pawloski |
| 2005/0175940 | A1 | 8/2005 | Dierichs |
| 2005/0233081 | A1 | 10/2005 | Tokita |
| 2005/0266354 | A1 | 12/2005 | Li |
| 2006/0023184 | A1 | 2/2006 | Coon |
| 2006/0066339 | A1 | 3/2006 | Rajski |
| 2006/0085772 | A1 | 4/2006 | Zhang |
| 2006/0161452 | A1 | 7/2006 | Hess |
| 2006/0188804 | A1 | 8/2006 | Allen |
| 2007/0015365 | A1 | 1/2007 | Chen |
| 2007/0020565 | A1 | 1/2007 | Koh |
| 2007/0072090 | A1 | 3/2007 | Chang |
| 2007/0072376 | A1 | 3/2007 | Chen |
| 2007/0158756 | A1 | 7/2007 | Dreeskornfeld |
| 2007/0215040 | A1 | 9/2007 | Huang |
| 2007/0218661 | A1 | 9/2007 | Shroff |
| 2008/0061366 | A1 | 3/2008 | Liu |
| 2008/0067335 | A1 | 3/2008 | Hou |
| 2008/0248429 | A1 | 10/2008 | Chou |
| 2009/0057759 | A1 | 3/2009 | Obradovic |
| 2009/0124097 | A1 | 5/2009 | Cheng |
| 2009/0191723 | A1 | 7/2009 | Huang |

(Continued)

*Primary Examiner* — Daborah Chacko Davis
(74) *Attorney, Agent, or Firm* — Winston Hsu; Scott Margo (57) ABSTRACT

A method for forming a semiconductor structure having an opening is provided. First, a substrate is provided, wherein a first region and a second region are defined on the substrate and an overlapping area of the first region and the second region is defined as a third region. A pattern density of the first region is substantially greater than that of the second region. Then, a material layer is formed on the substrate. A first hard mask and a second hard mask are formed on the material layer. The first hard mask in the first region is removed to form a patterned first hard mask. The second hard mask in the third region is removed to form a patterned second hard mask. Lastly, the material layer is patterned by using the patterned second hard mask layer as a mask to form at least an opening in the third region only.

18 Claims, 5 Drawing Sheets

(56) References Cited

U.S. PATENT DOCUMENTS

| | | |
|---|---|---|
| 2009/0193385 A1 | 7/2009 | Yang |
| 2009/0200494 A1 | 8/2009 | Hatem |
| 2009/0233238 A1 | 9/2009 | Hsu |
| 2009/0258500 A1 | 10/2009 | Yang |
| 2009/0278569 A1 | 11/2009 | Taoka |
| 2009/0300576 A1 | 12/2009 | Huang |
| 2010/0036644 A1 | 2/2010 | Yang |
| 2010/0044783 A1 | 2/2010 | Chuang |
| 2010/0048027 A1 | 2/2010 | Cheng |
| 2010/0070944 A1 | 3/2010 | Wu |
| 2010/0086862 A1 | 4/2010 | Yang |
| 2010/0129994 A1 | 5/2010 | Awad |
| 2010/0131914 A1 | 5/2010 | Wu |
| 2010/0175041 A1 | 7/2010 | Krasnoperova |
| 2011/0029939 A1 | 2/2011 | Yang |
| 2012/0248609 A1* | 10/2012 | Tomita .................. 257/751 |

\* cited by examiner

METHOD FOR FORMING SEMICONDUCTOR STRUCTURE HAVING OPENING

BACKGROUND OF THE INVENTION

1. Field of the Invention

The present invention relates to a method for forming a semiconductor structure having an opening, and more particularly, to a method that uses two lithography processes to define a first region and a second region so that the formed opening is formed in the overlapping area of the first region and the second region.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices has become finer. However, the width is subject to optical characteristics. To obtain fine-sized devices in the exposure, the interval between transparent regions in a mask is scaled down with device size. When the light passes through the mask, diffraction occurs, which reduces the resolution. Moreover, when light passes through the transparent regions of a mask having different interval sizes, the light through the regions having small interval sizes is influenced by the transparent regions having large interval sizes, which results in a deformation of the transfer pattern.

A double-exposure technique has been developed in recent years. The double-exposure technique involves decomposing a target pattern into two separated patterns, which are then transferred to a photoresist layer respectively by two exposure processes. Since the pitch of the decomposed pattern is larger, the pattern can be formed by current exposure systems. However, the patterns are formed by two separated lithography processes, so the two sets of patterned may not be identical. For example, one set of patterns formed by one lithography process may be larger than another set of patterns formed by another lithography process that may be smaller. Moreover, the spacing between two set of patterns may become different. This can seriously affect the quality of devices.

SUMMARY OF THE INVENTION

The present invention therefore provides a novel method for forming a semiconductor structure having an opening, wherein the method does not use conventional double exposure systems and wherein the drawbacks of un-identical patterns can be avoided.

According to one embodiment of the present invention, a method for forming a semiconductor structure having an opening is provided. First, a substrate is provided, wherein a first region and a second region are defined on the substrate and an overlapping area of the first region and the second region is defined as a third region. A pattern density of the first region is substantially greater than that of the second region. Then, a material layer is formed on the substrate. A first hard mask and a second hard mask are formed on the material layer. The first hard mask in the first region is removed to form a patterned first hard mask. The second hard mask in the third region is removed to form a patterned second hard mask. Lastly, the material layer is patterned by using the patterned second hard mask layer as a mask to form at least an opening in the third region only.

According to another embodiment of the present invention, a method for forming a semiconductor structure having an opening is provided. First, a substrate is provided, wherein a first region and a second region are defined on the substrate and an overlapping area of the first region and the second region is defined as a third region. The third region has a length defined by the first region and a width defined by the second region, wherein the length is greater than the width. Then, a material layer is formed on the substrate. A first hard mask and a second hard mask are formed on the material layer. The first hard mask in the first region is removed to form a patterned first hard mask. The second hard mask in the third region is removed to form a patterned second hard mask. Lastly, the material layer is patterned by using the patterned second hard mask layer as a mask to form at least an opening in the third region only.

In the present invention, the opening is formed only in the overlapping region of the first region and the second region. The present invention specifically demonstrates that the etching process to pattern larger sized region is performed first and the etching process to pattern the smaller sized region is performed later, so the corner loss effect in conventional arts can be avoided. Accordingly, the patterns formed in present invention can be more precise and identical.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
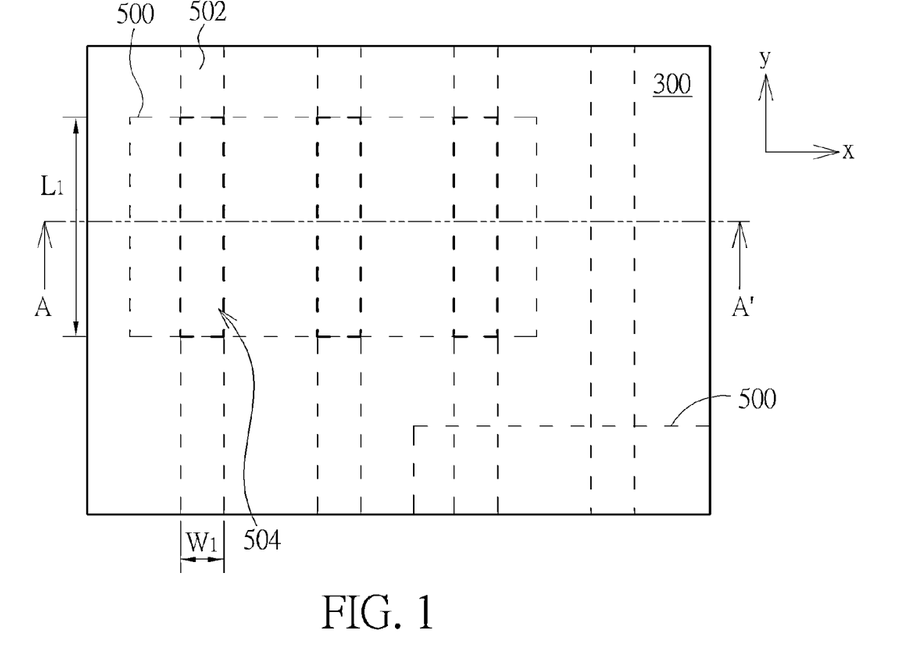
FIG. 1 to FIG. 8 illustrate schematic diagrams of the method for forming a semiconductor structure having an opening according to one embodiment of the present invention.

Please refer to FIG. 1 to FIG. 8, which illustrate schematic diagrams of the method for forming a semiconductor structure having an opening according to one embodiment of the present invention. FIG. 1 shows a top view and FIG. 2 to FIG. 8 show cross-sectional views taken along line AA' in FIG. 1. As shown in FIG. 1, a substrate 300 is provided. The substrate 300 may be a silicon substrate, an epitaxial silicon substrate, a silicon germanium substrate, a silicon carbide substrate or a silicon-on-insulator (SOI) substrate, but is not limited thereto. In another embodiment, the substrate 300 can include a non-semiconductor substrate, such as a glass substrate for a thin-film-transistor display device formed thereon, or a fused quartz for a photo-mask formed thereon. In another embodiment, the substrate 300 can include a plurality of doping regions, one or a plurality of dielectric layers or a metal interconnect system in which one or a plurality of microelectronic components are disposed therein, such as a complementary metal oxide semiconductor (CMOS) or a photodiode.

At least a first region 500 and at least a second region 502 are defined on the substrate 300. In one embodiment, the first region 500 has a larger area and the second region 502 has a smaller area on the substrate 300. For instance, the first region 500 is a larger rectangle pattern and the second region 502 is a fine stripe pattern. In embodiment, the first region 500 stretches along a direction (such as the x-axis in FIG. 1) and the second region 502 stretches along another direction (such as the y-axis in FIG. 1). In one preferred embodiment, the second regions 502 are arranged evenly on the substrate 300. The second region 502 has a width w1 (defined by the value objected to the x-axis) which is substantially equal to the CD (critical dimension) of the exposure system. The first region 500 has a length L1 (defined by the value objected to the y-axis) which is greater than the width W1. In another embodiment, the first region 500 and the second region 502 can have other shapes or have different configurations depending on the designs of the layout. However, it is preferably that each first region 500 has a larger size than that of each second region 502. Specifically, a pattern density of the first regions 500 is substantially greater than that of the second regions 502. For example, the pattern density of the first regions 500 is between 27% and 32%, and the pattern density of the second regions 502 is between 20% and 27% (the pattern density refers to the ratio of the total first regions 500 (or the total second regions 502) vs. total die region). A third region 504 (marked by bold dashed line) is defined as the overlapping region of the first region 500 and the second region 502. Since the first region 500 has a greater size than the second region 502, more than one third regions 504 may be disposed within one first region 500. It is shown in FIG. 1 that each third region 504 has a length L1 defined by the first region 500 and a width W1 defined by the second region 502, and the length L1 is greater than the width W1. In the subsequent steps, an opening will be formed within the third region 504.

Figure 2:
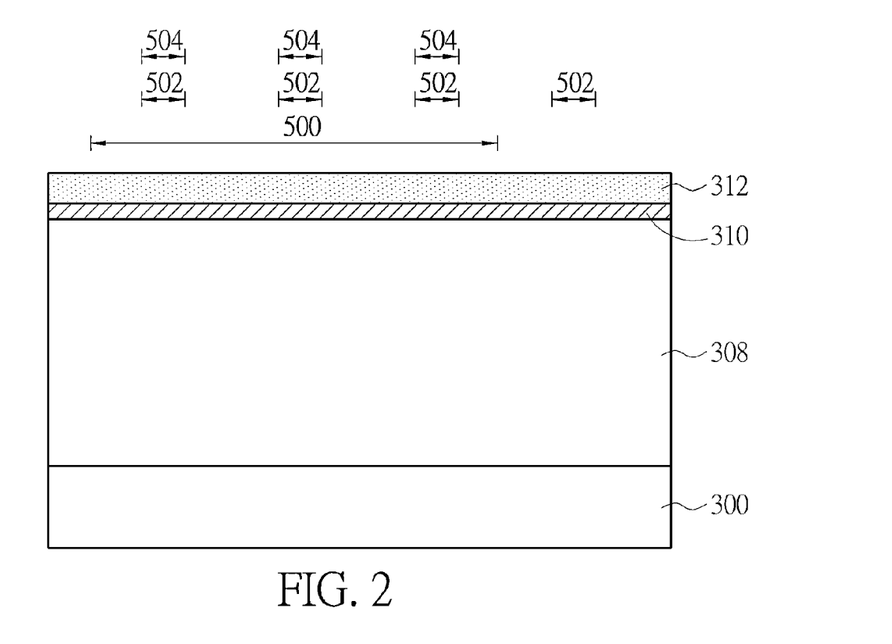

As shown in FIG. 2, a material layer 308 is formed on the substrate 300. In one embodiment, the material layer 308 can contain one or more than one dielectric layers, such as $SiO_2$, tetraethyl orthosilicate (TEOS), plasma enhanced etraethyl orthosilicate (PETEOS), but not limited thereto. The method for forming the material layer 308 can include a chemical vapor deposition (CVD) process, a spin coating process, or other suitable processes that can form any dielectric materials. Then, a first hard mask 312 and a second hard mask 310 are formed on the material layer 308, wherein the first hard mask 312 is disposed on the second hard mask 310. The second hard mask 310 has an etching selectivity with respect to the first hard mask 312, and the material layer 308. That is, by using the same etchant, the etching rate of the first hard mask 312 is different from that of the second hard mask 310 and the material layer 308. In one embodiment, the first hard mask 312 includes silicon oxide ($SiO_2$), silicon nitride (SiN), silicon carbide (SiC) or silicon oxynitride (SiON), and the second hard mask 310 comprises advanced pattern film (APF) supplied by the Applied Materials company.

Figure 3:
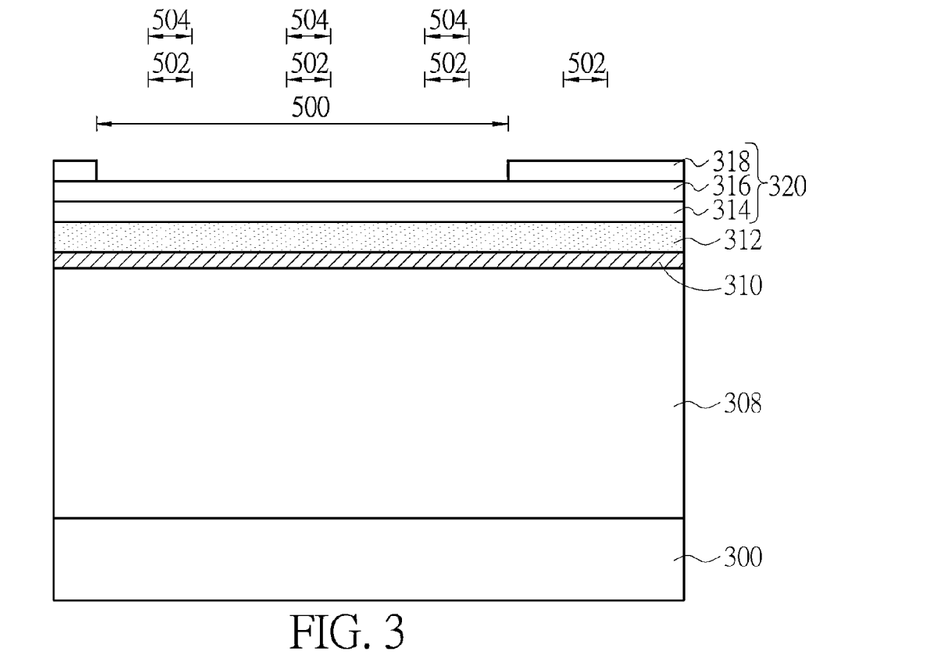

As shown in FIG. 3, a lithography process using a tri-layer photoresist 320 is performed. The tri-layer photoresist 320 contains a photoresist layer 318, an anti-reflection coating (ARC) 316 and an auxiliary mask layer 314. In one embodiment, the photoresist layer 318 is a photoresist material suitable for light source having a wavelength of 193 nm. The ARC layer 316 includes a silicon-containing hard-mask bottom anti-reflection coating (SHB) layer and the auxiliary mask layer 314 includes an organic dielectric layer (ODL) provided by Shin-Etsu Chemical Co. Ltd., wherein the SHB layer is disposed directly under the photoresist layer to serve as a BARC and a mask layer, and the ODL layer is an organic underlayer, i.e., a hydrocarbon, which is used to serve as an auxiliary mask layer. As shown in FIG. 3, the photoresist layer 318 undergoes an exposure process and a development process to remove the photoresist layer 318 in the first region 500.

Figure 4:
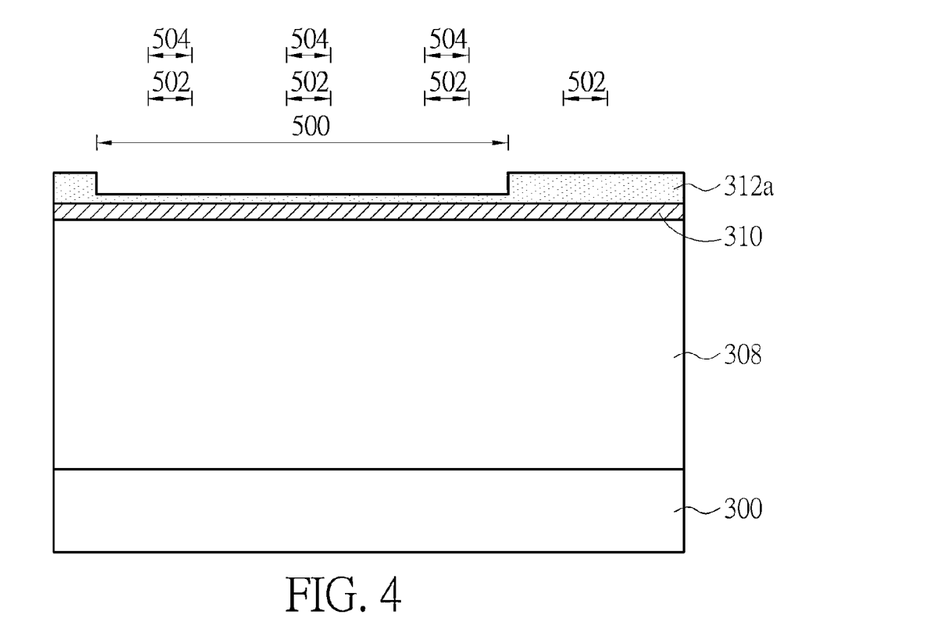

Then, as shown in FIG. 3 to FIG. 4, at least one etching process is performed by using the patterned photoresist layer 318 as a mask to sequentially pattern the ARC layer 316, the auxiliary mask layer 314, and further pattern the first hard mask 312, thereby removing the first hard mask 312 in the first region 500. A patterned first hard mask 312a having an opening corresponding to the first region 500 is therefore formed. In one preferred embodiment, when the second mask layer 310 includes APF, the second mask layer 310 is not exposed by the patterned first hard mask 312a. In another embodiment, when the second mask layer 310 includes another material, the second mask layer 310 can be exposed by the patterned first hard mask 312a. The tri-layer photoresist 320 is then removed away. It is noted that besides using the tri-layer photoresist 320, the patterned first hard mask 312a can also be formed by using other suitable photoresist materials and hard masks.

Figure 5:
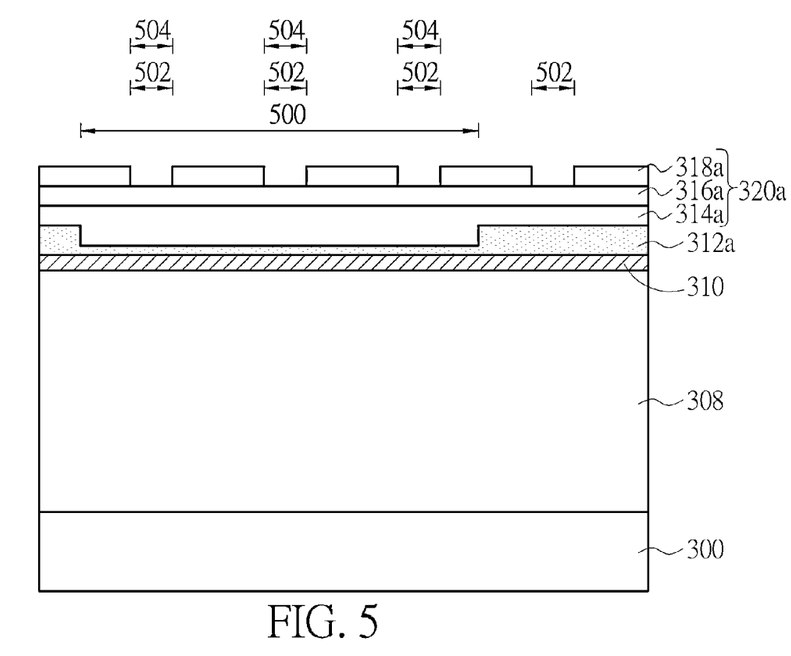

As shown in FIG. 5, another tri-layer 320a is formed on the patterned first hard mask 312a. The tri-layer 320a contains a photoresist layer 318a, an anti-reflection coating (ARC) 316a and an auxiliary mask layer 314a, wherein each layer contains a material similar to that of the tri-layer 320. Then, the photoresist layer 318a undergoes an exposure process and a development process to remove the photoresist layer 318a in the second region 502.

Figure 6:
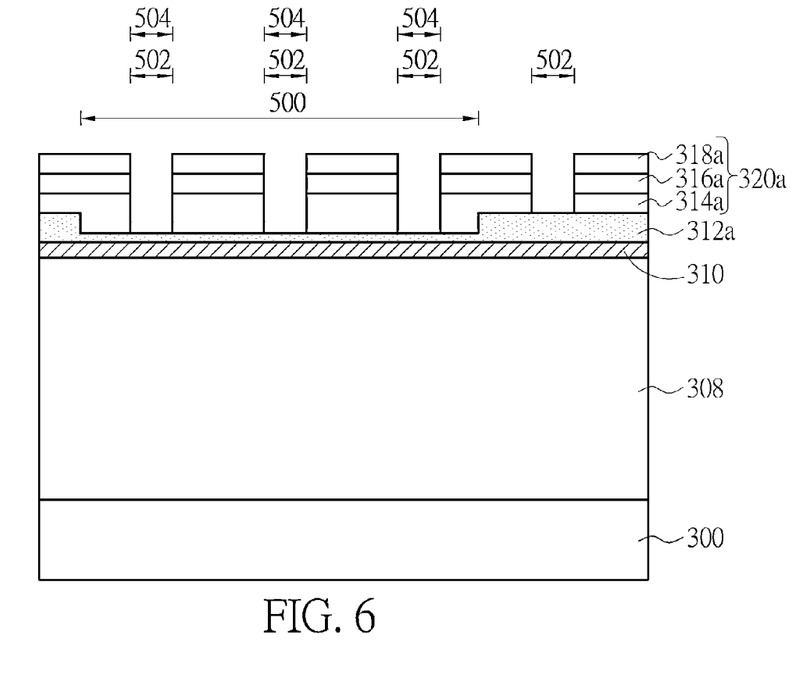

As shown in FIG. 5 to FIG. 6, at least an etching process is performed by using the patterned photoresist layer 318a as a mask to sequentially remove the ARC layer 316a, the auxiliary mask layer 314a in the second region 502, thereby exposing the patterned first hard mask 312a.

Figure 7:
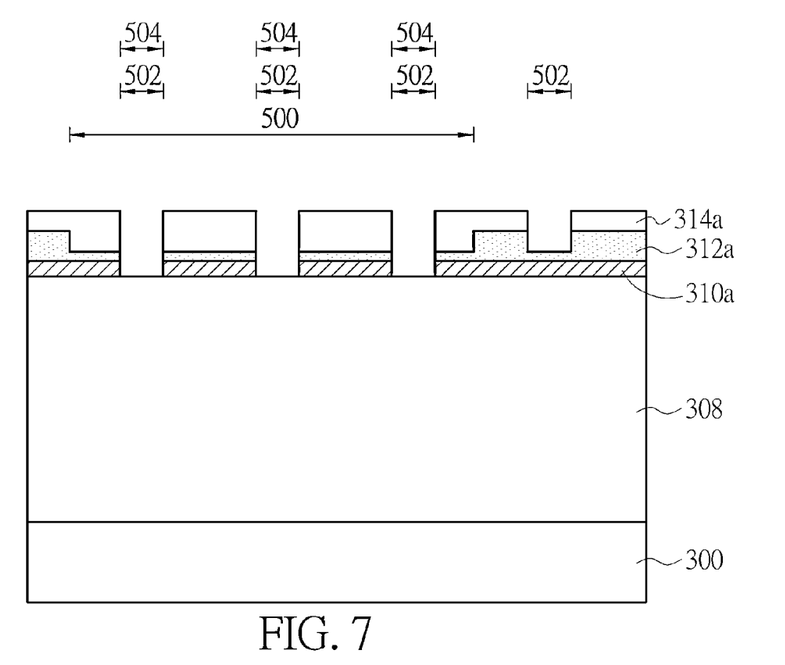

Subsequently, as shown in FIG. 6 to FIG. 7, the patterned photoresist layer 318a and the ARC 316a are removed away by an ashing process. Since the patterned first mask layer 312a does not expose the second mask layer 310, the second mask layer 310 (which is made of APF) is not influenced by the ashing process when removing the patterned photoresist layer 318a. Next, another etching process is performed by using the auxiliary mask layer 314a as a mask to pattern the patterned first mask layer 312a and the second mask layer 310. It is noted that since a portion of the patterned first mask layer 312a in the first region 500 has been removed in the previous etching step, in this etching step, the portion of the patterned first mask layer 312a and the second mask layer 310 in the overlapping region of the first region 500 and the second region 502, namely the third region 504, are removed. On the contrary, as shown in FIG. 7, in the right-most second region 502, since the first mask layer 312 is not etched in the previous etching process, the patterned first mask layer 312a is not etched through and the patterned second mask layer 310a is not exposed. The bottom surface of the hole formed in the right-most second region 502 may be disposed in the patterned first mask layer 312a or the patterned second mask layer 310a and does not expose the material layer 308. Thereafter, a patterned second hard mask 310a having an opening corresponding to the third region 504 is formed, and the material layer 308 is exposed only in the third region 504. Then, the auxiliary mask layer 314a and the patterned first mask layer 312a are removed away.

Figure 8:
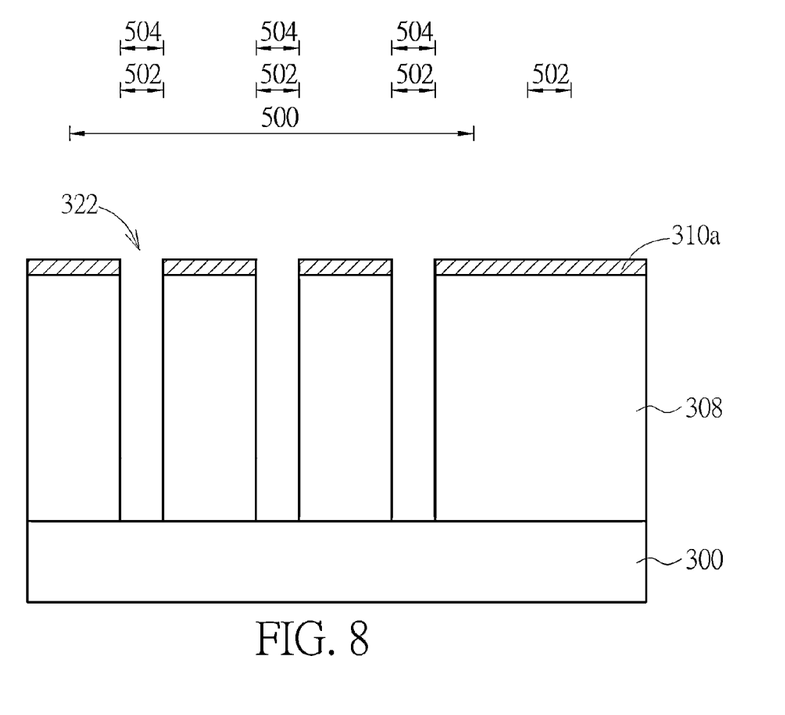

As shown in FIG. 8, at least an etching process is carried out by using the patterned second hard mask 310a as a mask to remove the material layer 308. An opening 322 is therefore formed in the material layer 308, wherein the opening 322 exposes the substrate 300 only in the third region 504. After forming the opening 322, the patterned second mask layer 310a composed of APF can be easily removed from the substrate 300 by an ashing process.

From the above description, the present invention provides a method for forming a semiconductor structure having an opening. Comparing to conventional arts, the double-exposure technique decomposes a target pattern into two separated patterns, so the assembling of the two patterns will be the final pattern on the wafer. However, in the present invention, only the overlapping area of the two regions will be the final pattern on the wafer. Since the final pattern is defined both by the first region and the second region, the drawback in conventional double-exposure technique such as un-identical patterns and unequal spacing can be avoided.

Figure 9:
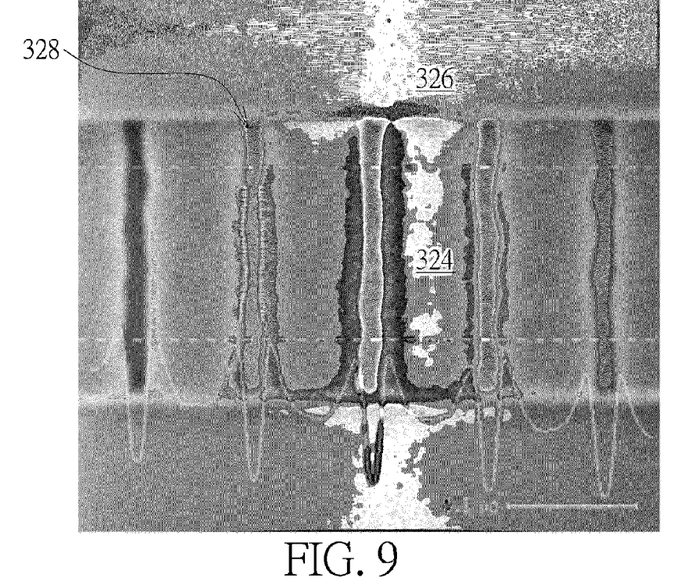
FIG. 9 and FIG. 10 are pictures showing the corner loss effect.
Figure 10:
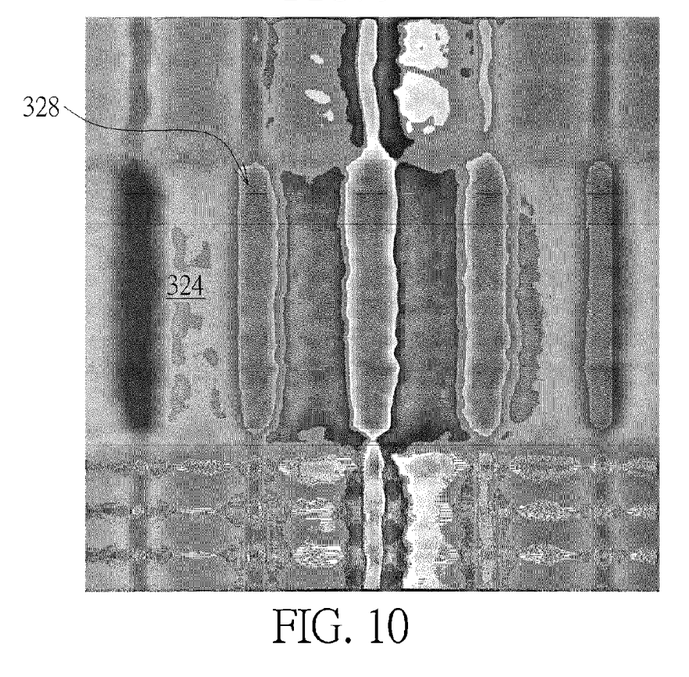

Moreover, in the present invention, the first region 500, comparing to the second region 502 or the third region 504, has a larger size, and it is one salient feature that the etching step to remove the first mask layer 312 in the first region 500 is performed first, and then the etching step to remove the second mask layer 310 in the second region 502 is performed later. By doing this, the CD of the smaller sized region (the second region 502) will not be influenced by the etching process when etching the larger sized region (the first region 500). On the contrary, if the etching process to pattern smaller sized region is performed first and the etching process to pattern larger sized region is performed later, the smaller sized region will be influenced because of the "corner loss effect." Please refer to FIG. 9 and FIG. 10, which are pictures showing the corner loss effect. As shown in FIG. 9, the mask layer 324 has been patterned in the second region 502, which has a plurality of fine patterns 328. The photoresist 326 with an opening corresponding to the first region 500, which has a larger size, is formed on the mask layer 324. Next, as shown in FIG. 10, when using the photoresist 326 as a mask to pattern the mask layer 324, the width of the fin pattern 328 will be enlarged. It is shown from FIG. 9 and FIG. 10 that the corner loss effect will result in the enlargement of the fine pattern CD, which will cause the misalignment problem.

In summary, the present invention specifically demonstrates that the etching process to pattern larger sized region is performed first and the etching process to pattern the smaller sized region is performed later, so the corner loss effect in conventional arts can be avoided. By doing this, the patterns formed in present invention can be more precise and identical. It is understood that the opening formed by the present invention can be used as a contact plug of a transistor or any semiconductor structure, or even an optical device or a micro-electro-mechanical systems (MEMS).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure having an opening, comprising:
   providing a substrate having a die region, wherein a plurality of first regions and a plurality of second regions are defined within the die region and an overlapping area of the first regions and the second regions is defined as a plurality of third regions, more than one third regions are located within one first region, a ratio of total area of the first regions and the die region is defined as a first pattern density, a ratio of total area of the second regions and the die region is defined as a second pattern density, wherein the first pattern density is greater than the second pattern density;
   forming a material layer on the substrate;
   forming a first hard mask and a second hard mask on the material layer, wherein the first hard mask is disposed on the second hard mask;
   removing a part of the first hard mask in the first regions to form a patterned first hard mask;
   after forming the patterned first hard mask, removing a part of the second hard mask in the third regions to form a patterned second hard mask; and
   patterning the material layer by using the patterned second hard mask as a mask, to form a plurality of openings only in the third regions.

2. The method of forming a semiconductor structure having an opening according claim 1, wherein the first pattern density is between 27% and 32%.

3. The method of forming a semiconductor structure having an opening according claim 1, wherein the second pattern density is between 20% and 27%.

4. The method of forming a semiconductor structure having an opening according claim 1, wherein each third region has a length defined by the first region and a width defined by the second region, wherein the length is greater than the width.

5. The method of forming a semiconductor structure having an opening according claim 4, wherein each first region stretches along a direction parallel to the width.

6. The method of forming a semiconductor structure having an opening according claim 4, wherein each second region stretches along a direction parallel to the length.

7. The method of forming a semiconductor structure having an opening according claim 4, wherein the second regions are arranged evenly on the substrate.

8. The method of forming a semiconductor structure having an opening according claim 4, wherein the width corresponds to a critical dimension (CD) of the exposure system.

9. The method of forming a semiconductor structure having an opening according claim 1, wherein the first hard mask has an etching selectivity with respect to the second hard mask.

10. A method of forming a semiconductor structure having an opening, comprising:
    providing a substrate, wherein a plurality of first regions and a plurality of second regions are defined on the substrate and an overlapping area of the first regions and the second regions is defined as a plurality of third regions, and more than one third regions are located within one first region, wherein each third region has a length defined by one of the first region and a width defined by one of the second region, wherein the length is greater than the width;
    forming a material layer on the substrate;
    forming a first hard mask and a second hard mask on the material layer, wherein the first hard mask is disposed on the second hard mask;
    removing a part of the first hard mask in the first region to form a patterned first hard mask;
    after forming the patterned first hard mask, removing a part of the second hard mask in the third region to form a patterned second hard mask; and
    patterning the material layer by using the patterned second hard mask as a mask, to form a plurality of openings only in the third region.

11. The method of forming a semiconductor structure having an opening according claim 10, wherein a ratio of total area of the first regions and the die region is defined as a first pattern density, a ratio of total area of the second regions and the die region is defined as a second pattern density, wherein the first pattern density is greater than the second pattern density.

12. The method of forming a semiconductor structure having an opening according claim 11, wherein the first pattern density is between 27% and 32%.

13. The method of forming a semiconductor structure having an opening according claim 11, wherein the second pattern density is between 20% and 27%.

14. The method of forming a semiconductor structure having an opening according claim 10, wherein each first region stretches along a direction parallel to the width.

15. The method of forming a semiconductor structure having an opening according claim 10, wherein each second region stretches along a direction parallel to the length.

16. The method of forming a semiconductor structure having an opening according claim 10, wherein the second regions are arranged evenly on the substrate.

17. The method of forming a semiconductor structure having an opening according claim 10, wherein the width corresponds to a critical dimension (CD) of the exposure system.

18. The method of forming a semiconductor structure having an opening according claim 10, wherein the first hard mask has an etching selectivity with respect to the second hard mask.

* * * * *